United States Patent
Mehdianpour et al.

(10) Patent No.: US 6,877,217 B1
(45) Date of Patent: Apr. 12, 2005

(54) APPARATUS FOR HANDLING ELECTRICAL COMPONENTS

(75) Inventors: Mohammad Mehdianpour, Munich (DE); Ralf Schulz, Munich (DE)

(73) Assignee: Siemens Production & Logistics Systems AG, Nuremburg (DE)

( * ) Notice: Subject to any disclaimer, the term of this patent is extended or adjusted under 35 U.S.C. 154(b) by 0 days.

(21) Appl. No.: 09/913,311

(22) PCT Filed: Feb. 2, 2000

(86) PCT No.: PCT/DE00/00314

§ 371 (c)(1),
(2), (4) Date: Aug. 10, 2001

(87) PCT Pub. No.: WO00/51408

PCT Pub. Date: Aug. 31, 2000

(30) Foreign Application Priority Data

Feb. 25, 1999 (DE) .................................. 199 08 206

(51) Int. Cl.[7] .............................................. B23P 19/00
(52) U.S. Cl. ........................... 29/743; 29/740; 29/739; 29/832; 29/840
(58) Field of Search ........................ 29/743, 740, 739, 29/832, 840; 294/64.1

(56) References Cited

U.S. PATENT DOCUMENTS

| | | | | |
|---|---|---|---|---|
| 4,135,630 A | * | 1/1979 | Snyder et al. | 414/627 |
| 4,619,043 A | | 10/1986 | Takahashi et al. | 29/740 |
| 4,706,379 A | * | 11/1987 | Seno et al. | 29/740 |
| 4,794,689 A | * | 1/1989 | Seno et al. | 29/740 |
| 4,875,285 A | | 10/1989 | Haan et al. | 29/832 |
| 5,136,776 A | * | 8/1992 | Yanagisawa | 29/740 |
| 5,410,801 A | * | 5/1995 | Shiloh et al. | 29/740 |
| 5,743,005 A | * | 4/1998 | Nakao et al. | 29/740 |
| 5,790,651 A | * | 8/1998 | Suzuki et al. | 29/739 |
| 6,073,342 A | * | 6/2000 | Asai et al. | 29/740 |
| 6,276,051 B1 | * | 8/2001 | Asai et al. | 29/740 |

FOREIGN PATENT DOCUMENTS

JP          404013590 A   *  1/1992

* cited by examiner

*Primary Examiner*—Carl J. Arbes
*Assistant Examiner*—Tai Nguyen
(74) *Attorney, Agent, or Firm*—Harness, Dickey & Pierce, P.L.C.

(57) ABSTRACT

An apparatus for handling electrical components is provided with a head. The head may include at least one gripper and a storage element which can be filled with the electrical components. The head may move over the substrate, and the gripper may remove components from the storage element and place them onto the substrate.

24 Claims, 2 Drawing Sheets

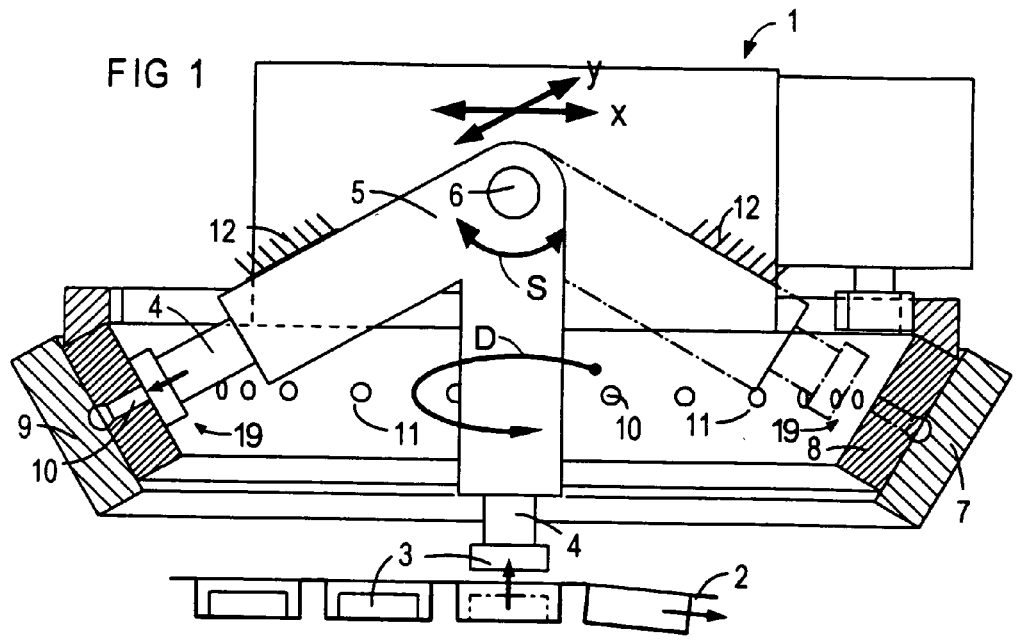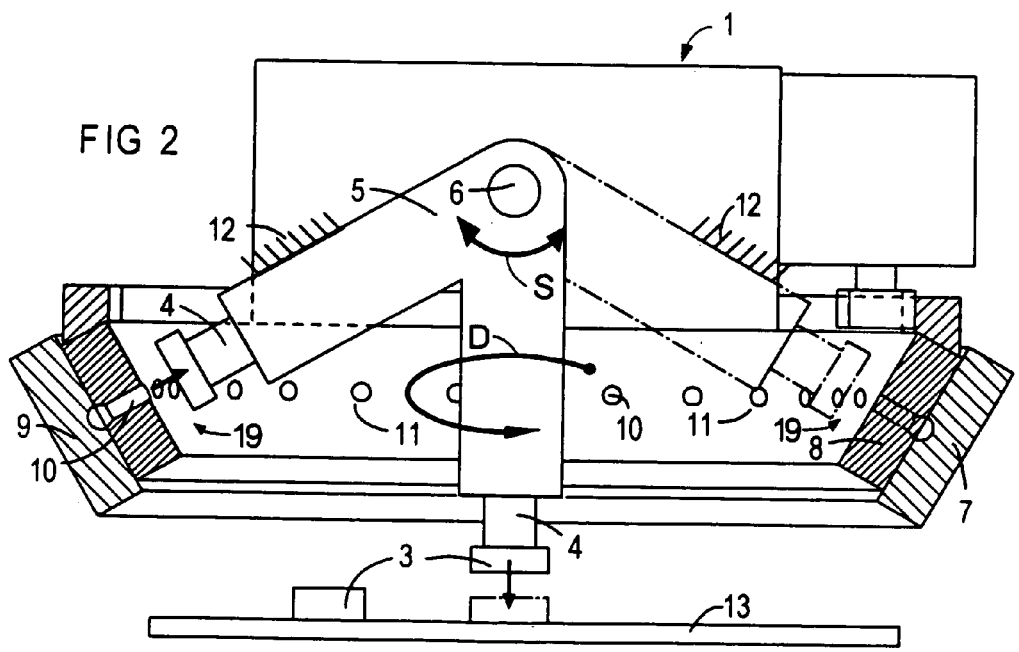

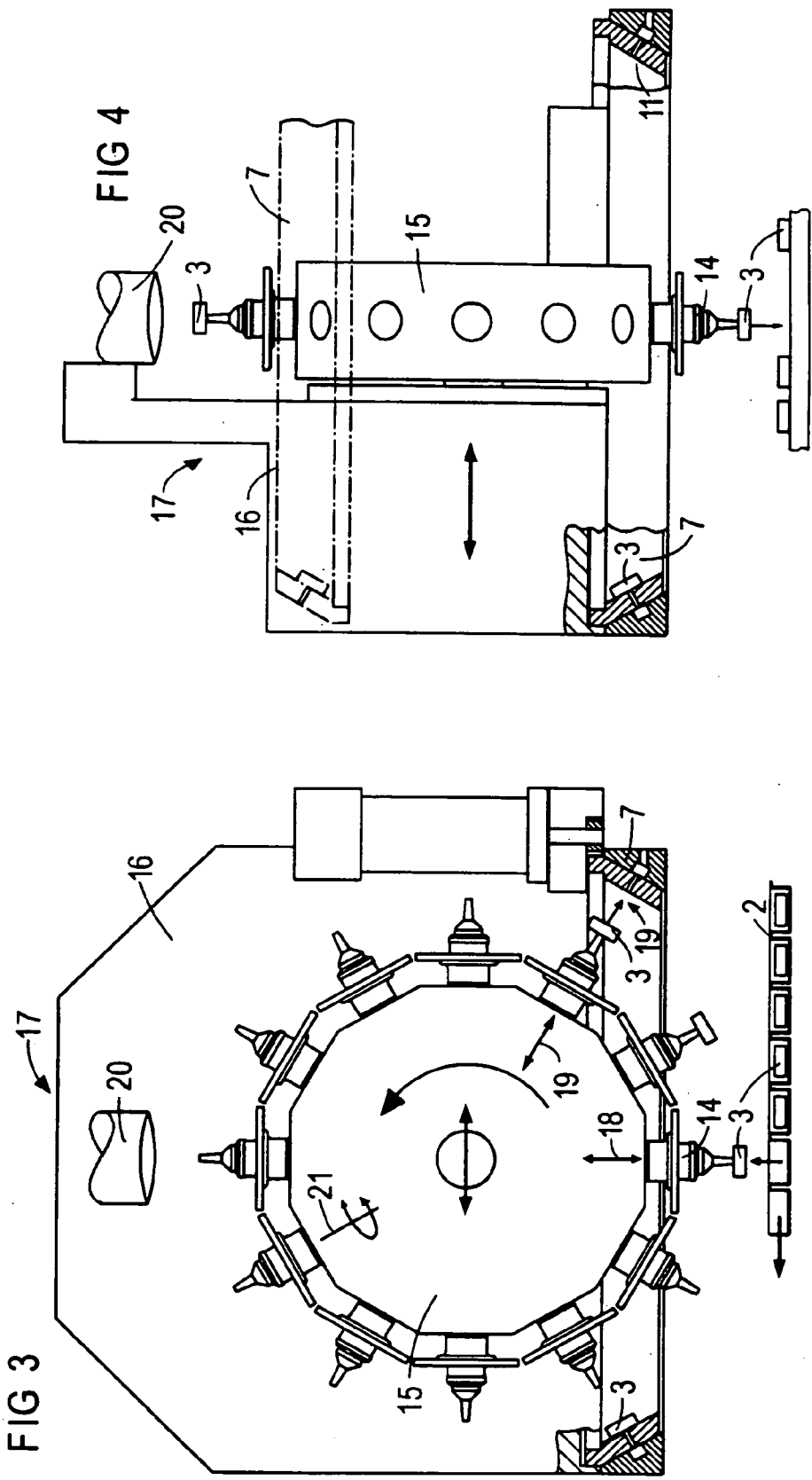

APPARATUS FOR HANDLING ELECTRICAL COMPONENTS

BACKGROUND OF THE INVENTION

1. Field of the Invention

The present invention generally relates to apparatuses for equipping substrates with electrical components. In particular, the present invention relates to apparatuses using a moveable equipping head for handling electrical components.

2. Discussion of the Related Art

Basic devices of this type have been generally disclosed. For example, in U.S. Pat. No. 4,875,285, a turret-like equipping head has a large number of grippers constructed as suction pipettes, which picks up components at the feed locations. From there, the equipping head moves to a printed circuit board which is fixed in the apparatus and onto which the components are placed successively. In this case, the number of components transported is restricted to the number of suction pipettes. After the placement action, the equipping head must be moved again to the feed devices arranged outside the equipping area.

It is notable that large components, for example multi-pin ICs, cannot be handled by the turret head for reasons of space, and such turret heads usually have only one gripper with which only one large component can be transported in each case.

SUMMARY OF THE INVENTION

The present invention is based on the object of increasing the equipping performance with a low constructional outlay.

This object is achieved by the equipping head with a storage element according to the present invention. The storage element can be designed to be sufficiently large that it is able to accommodate a large number of components. In this case, the equipping head in the area of the feed devices picks up components until the storage element has been filled. Then, the equipping head moves over the substrate to be fitted, where the gripper removes the components from the storage element and places them successively onto the proper locations. An equipping head of this type needs only a single gripper for filling and emptying the storage element. Since, only low relative movements take place between the gripper and the storage element, these operations are able to proceed quickly, similar to that in the turret head.

In mechanical terms, the storage element can be configured more simply than the grippers of the turret head. In addition, the storage element can be kept so large that it accommodates a considerably larger number of components, as a result of which the equipping head has to move less often between the feed devices and the substrate.

In one embodiment, the components can be transported between the gripper and the storage element in simple movement sequences.

The pivoting part as provided in a further embodiment provides an easy relative movement of the gripper between the placement and the transfer position.

In another embodiment, the component can easily be fetched from the feed devices, transferred to the storage element, removed from the latter, and placed onto the substrate.

In a further embodiment, the transfer between the gripper and the storage element can be controlled in such a way that the component is held safely in every phase.

In another embodiment, the action of positioning the components is simplified. It is possible to use a sensing device, for example an optical sensing device, to determine the position of the components to one of the stepping positions. Since the transferring of the components from the sliding part to the gripper is carried out in a defined manner, it is possible to use the position data obtained from the sensing device to correct the angle and position of the components.

Also, suction openings can be provided with the sliding part so as to constitute simple holding means for the components on the sliding part. This provides a way for the components to be held and transferred on the sliding part in a simple way. The sliding part can also be provided in the form of annular design being rotatably mounted, which readily permits vertical placement of the components onto the storage spaces or onto the substrate.

Accordingly, the operations of fetching components from the feed devices and filling the storage element can be accelerated, in that in each case, one of the grippers is located in the fetch position and another gripper is located in the transfer position. In the same way, the actions of emptying the storage element and equipping the substrate are also accelerated.

In another embodiment, two grippers in a pendulum-like movement, alternately assume the placement position and the transfer position. In this case, however, each individual gripper must be assigned its own transfer position. In the case of a sliding part which is concentric with the placement position, this can be implemented in a straightforward manner by the two transfer stations being located diametrically opposite each other. A filling cycle can then be carried out with half a revolution of the sliding part, each of the two grippers filling one half of the ring.

In another embodiment, the pivoting part can be indexed in a rotational movement without any change of direction. Since, the grippers are no longer primarily used for storing the components, the number of grippers can be reduced to the number of working stations provided without any loss in performance. If, in addition to a placement station and a transfer station, a sensing and a rotation station are further provided, only four grippers would be needed.

In another embodiment, the working stations are being provided along a circulation path of the grippers, on a stator of the equipping head. Here, at least one of the working stations form the transfer station. Accordingly, components can be transferred at the clock rate of the equipping head without any loss of time.

By placing a sensing station between the transfer station and the placement station, it is possible to perform positional control and position correction of the components following removal from the storage element, and directly before the last handling step of the placement onto the substrate.

By using an additional storage element, storage capacity can be increased considerably. In the case of a turret-like equipping head, it is easily possible to assign a second transfer station to a previously unused holding station.

BRIEF DESCRIPTION OF THE DRAWINGS

FIG. 1 shows in schematic form an equipping head having two grippers;

FIG. 2 shows the equipping head according to FIG. 1 in a different working phase;

FIG. 3 shows a side view of an equipping head with grippers arranged in a turret; and FIG. 4 shows an end view of the equipping head according to FIG. 3.

BRIEF DESCRIPTION OF THE PREFERRED EMBODIMENTS

As shown in FIG. 1, an equipping head 1 can be moved in the direction of the indicated arrows X and Y in two coordinate directions by means of a positioning system (not illustrated), between feed devices and a substrate. Feed devices of this type have, mutually parallel component tapes 2, having pockets in which electronic components 3 are held. By means of stepwise displacement of the component tape 2, the pockets can be displaced into a fetch position, in which a respective component 3 can be removed from the component tape 2 in the indicated vertical arrow direction by a gripper 4, by suction.

Gripper 4 is guided in a pivoting part 5 and can be displaced in the fetch direction, perpendicular to the plane of movement. It is lowered with its holding end onto the component, which is lying in a ready position and arrives in the active range of a suction channel of the gripper 4. By means of withdrawing the gripper 4, the component 3 is removed from the component tape and lifted into the transport position illustrated in FIG. 1.

The pivoting part 5 can be pivoted about a horizontal axis 6 in accordance with the circular arrow S. It has a second gripper 4, which is arranged in a V-shape with respect to the other gripper 4 in the pivoting plane of the pivoting part 5, in such a way that the longitudinal axes of the grippers 4 meet at the center of the axis 6.

In addition, the equipping head 1 has an annular storage element 7 which is concentric with the vertical gripper 4, and is provided with an annular sliding part 8 mounted on a stationary annular part 9 of the storage element 7, such that it can be rotated in the direction of rotation arrow D. A free inner side of the sliding part 9 is of conical design and provided with suction openings 10, which are arranged such that they run around at uniform pitch spacings. Suction openings 10 define storage spaces 11 for the components 3.

Pivoting part 5 can be pivoted between stops 12 belonging to the equipping head 1 in such a way that in each case, one of the grippers 4 is located in the vertical fetch position, and the other gripper is located in an oblique transfer position in which it is assigned to a transfer station 19 of the equipping head 1. At the same time, the sliding part 8 is rotated into a position assigned to one of the free storage spaces 11, likewise belonging to the transfer station 19. Gripper 4 is oriented perpendicular to the storage space 11. By means of a vertical placement movement of gripper 4, the previously fetched component 3 can be deposited on the storage space 11 of the sliding part 8.

During these transfer operations, pressure relationships in the suction opening 10 and the suction channel of the gripper 4 can be controlled in such a way, that the component 3 is held securely in every phase and can be transferred without being offset laterally.

By means of pivoting the pivoting part 5, the free gripper 4 can then be pivoted into the fetch position, and the other gripper 4 is moved into a different transfer position, in which it is assigned to a further transfer station 19 located diametrically opposite the other. Sliding part 8 is cycled in such a way that in each case, one of the storage spaces 11 is located in the transfer station 19, and the storage element 7 is already completely filled after half a revolution of the sliding part 8.

Then, according to FIG. 2, the equipping head 1 can be moved in an equipping area of the equipping apparatus above a substrate 13, onto which the component 3, in a movement sequence which is the reverse of that for filling, is removed successively a from the storage element 7 and placed onto the substrate 13.

According to FIGS. 3 and 4, a large number of grippers 14 are arranged on a rotor 15 mounted on a stator 16 of another equipping head 17, such that it can be rotated step by step. Various angular positions of the grippers 14 are associated with different working stations. These are, constructed as a placement station 18, a transfer station 19, a sensing station 20, and a rotating station 21.

In the placement station 18, the components 3 are removed from the component tape 2 and, in two steps, are pivoted as far as the transfer station. Located at their level is the annular storage element 7 having the conical sliding part 8 on whose storage spaces 11 the components 3 can successively be placed. After these locations have been filled, grippers 14 of the rotor 15 can be populated with additional components 3 in a further cycle such components may be less suitable for intermediate storage in the storage element 7 than the components 3 previously considered.

Equipping head 17 then moves until it is in a position above the substrate 13 to be fitted, as shown in FIG. 4. Here, the components 3 located on the grippers 14 are placed onto the substrate 13 in the placement station 18. During this cycle, the precise position of the components 3 is determined in the optical sensing station 20. In the following rotation station 21, the angular position of the components 3 is corrected by rotating the gripper 14 about its longitudinal axis, which is arranged such that it is vertically radial with respect to the axis of rotation of the rotor 15.

As soon as grippers 14 which have become free reach the transfer station 19, they successively remove components 3 from the synchronously corotating sliding part 8 of the gripper 7 and, after passing through the sensing station 20 and rotation the station 21, place said components 3 onto the substrate 13. After all the components 3 have been placed onto the substrate 13, equipping head 17 can be moved over the feed devices for a new fetch cycle.

It is possible to provide the equipping head 17, with at least one further storage element 7 and one further transfer station, as indicated by dash-dotted line in FIG. 4. Thus, the storage capacity of the equipping head 17 can be increased appropriately.

Although other modifications and changes may be suggested by those skilled in the art, it is the intention of the inventors to embody within the patent warranted hereon all changes and modifications as reasonably and properly come within the scope of their contribution to the art.

What is claimed is:

1. An apparatus for handling electrical components, the apparatus comprising:
    a head for handling the components, said head including at least one gripper and at least one storage element including a plurality of storage spaces for storing the electrical components,
    wherein said at least one storage element is separate from said at least one gripper whereby components picked up by said at least one gripper are depositable at said plurality of storage spaces of said at least one storage element such that the deposited components are removable from said plurality of storage spaces via said at least one gripper,
    wherein said plurality of storage spaces are distributed on a sliding part mounted on said head, said sliding part being displaceable relative to said head, such that when said sliding part is displaced, said plurality of storage spaces are displaced successively, and wherein said head is movable in two coordinate directions between a feed device and a substrate.

2. An apparatus according to claim 1, wherein said components are held at a holding end of said at least one gripper, said holding end being movable transversely with respect to a placement direction of said components into a transfer position assigned to a transfer station on said head, and said plurality of storage spaces in said head being successively displaced to said transfer station.

3. An apparatus according to claim 2, wherein said at least one gripper is mounted on a pivoting element of said head, and said holding end is pivotable transversely, with respect to the placement direction, between a placement station and said transfer station via the pivoting element.

4. An apparatus according to claim 3, wherein said at least one gripper is mounted in a guide in said pivoting element, such that said at least one gripper is displaceable longitudinally in the placement direction.

5. An apparatus according to claim 4, wherein said holding end in said transfer station is displaceable longitudinally in a direction relative to one of said plurality of storage spaces.

6. An apparatus according to claim 2, wherein said at least one gripper is a suction device, and a pressure condition in said suction device in a transfer position is controlled such that a holding force is greater than or less than a holding force exerted by one of said plurality of storage spaces.

7. An apparatus according to claim 2, wherein said sliding part is provided with suction openings for said components.

8. An apparatus according to claim 7, wherein said suction openings are permanently connected to a common suction line.

9. An apparatus according to claim 8, wherein said at least one storage element is provided with means for changing the pressure condition in said suction devices.

10. An apparatus according to claim 2, wherein said sliding part is of annular design and rotatably mounted.

11. An apparatus according to claim 10, wherein the axis of rotation of said sliding part is congruent with the longitudinal axis of said at least one gripper located in the placement position, and said plurality of storage spaces have supporting surfaces extending perpendicularly to the longitudinal axis of said at least one gripper.

12. An apparatus according to claim 11, wherein a pivoting element is provided with a plurality of guides for cooperation with said at least one gripper, and said plurality of guides can be pivoted successively into the transfer position.

13. An apparatus according to claim 12, wherein said pivoting element comprises, two holders, each having longitudinal axes forming a V shape with respect to each other in a pivoting plane, such that said holders are alternatively pivotable into the placement position in which a respective one of said holders is in the transfer position.

14. An apparatus according to claim 12, wherein said pivoting element is constructed as a turret-like rotor having a multiplicity of circularly arranged grabbers, and wherein the rotor is drivable and indexable in accordance with the angular pitch of said grabbers.

15. An apparatus according to claim 14, wherein a plurality of working stations are provided along a circulation path of said grabbers and a stator of said head, and at least one of said working stations forms a transfer station of said head.

16. An apparatus according to claim 15, wherein, in the direction of rotation of a rotor, between said transfer station and said placement station, a sensing station is disposed for determining the position of said components and a rotation station for said components.

17. An apparatus according to claim 16, wherein said head has one storage element, assigned to a transfer station.

18. An apparatus for handling electrical components, comprising:

an equipping head for handling the components, the head being movable in two coordinate directions between feed devices carrying the electrical components and a substrate, the head including, at least one storage element with a plurality of storage spaces, and at least one gripper for removing the electrical components from the feed devices and for attaching the electrical components to the substrate, wherein said at least one storage element and said at least one gripper are movable together with the head between the feed devices and the substrate, wherein said at least one gripper is for depositing components, picked up from the feed devices, to the plurality of storage spaces and for subsequently extracting components from the storage spaces and mounting them on the substrate.

19. The apparatus of claim 18, wherein the number of storage spaces is greater than the number of grippers.

20. An apparatus according to claim 18, wherein said components are held at a holding end of said at least one gripper, said holding end being movable transversely with respect to a placement direction of said components into a transfer position assigned to a transfer station on said head, and said plurality of storage spaces in said head being successively displaced to said transfer station.

21. An apparatus according to claim 20, wherein said at least one gripper is mounted on a pivoting element of said head, and said holding end is pivotable transversely, with respect to the placement direction, between a placement station and said transfer station via the pivoting element.

22. An apparatus according to claim 21, wherein said at least one gripper is mounted in a guide in said pivoting element, such that said at least one gripper is displaceable longitudinally in the placement direction.

23. An apparatus according to claim 22, wherein said holding end in said transfer station is displaceable longitudinally in a direction relative to one of said plurality of storage spaces.

24. An apparatus according to claim 20, wherein said at least one gripper is a suction device, and a pressure condition in said suction device in a transfer position is controlled such that a holding force is greater than or less than a holding force exerted by one of said plurality of storage spaces.

* * * * *